United States Patent
Taboch et al.

(10) Patent No.: US 12,327,753 B2
(45) Date of Patent: Jun. 10, 2025

(54) SUCTION GRIPPER FOR WARPED WORKPIECE

(71) Applicant: Core Flow Ltd., Daliyat el-Karmel (IL)

(72) Inventors: Roie Taboch, Yokneam Eilit (IL); Daniel Yahides, Kiryat Motzkin (IL); Ronen Lautman, Haifa (IL)

(73) Assignee: Core Flow Ltd., Daliyat el-Karmel (IL)

(*) Notice: Subject to any disclaimer, the term of this patent is extended or adjusted under 35 U.S.C. 154(b) by 840 days.

(21) Appl. No.: 17/607,029

(22) PCT Filed: May 13, 2020

(86) PCT No.: PCT/IL2020/050514
§ 371 (c)(1),
(2) Date: Oct. 28, 2021

(87) PCT Pub. No.: WO2020/230125
PCT Pub. Date: Nov. 19, 2020

(65) Prior Publication Data
US 2022/0216090 A1    Jul. 7, 2022

Related U.S. Application Data

(60) Provisional application No. 62/848,601, filed on May 16, 2019.

(51) Int. Cl.
*H01L 21/683* (2006.01)
*B25J 15/06* (2006.01)

(52) U.S. Cl.
CPC ...... *H01L 21/6838* (2013.01); *B25J 15/0616* (2013.01)

(58) Field of Classification Search
CPC ............... H01L 21/6838; B25J 15/0683; B25J 15/0014; B25J 15/0616; B25J 15/0691
(Continued)

(56) References Cited

U.S. PATENT DOCUMENTS 6,467,824 B2 * 10/2002 Bolotin ............... H01L 21/6838
                                                          414/737
6,523,572 B1    2/2003 Levin et al.
(Continued)

FOREIGN PATENT DOCUMENTS

EP    2626181      8/2013
JP    2002-517088  6/2002
(Continued)

OTHER PUBLICATIONS

International Search Report for PCT Application No. PCT/IL2020/050514, mailed on Jun. 16, 2020.

*Primary Examiner* — Paul T Chin
(74) *Attorney, Agent, or Firm* — PEARL COHEN ZEDEK LATZER BARATZ LLP

(57) ABSTRACT

A gripper to grip a workpiece includes a body with a flat gripper surface. The gripper surface includes a plurality of openings that are distributed over the gripper surface, each of the openings connectable to a source of suction. At least one flow restrictor is located between the plurality of openings and a connector of the gripper to the source of suction to restrict the inflow through each opening of the plurality of openings. When the suction is applied to the plurality of openings and a part of the workpiece surface covers at least one opening of the plurality of openings and another of the openings remains uncovered, the suction force at the covered opening is sufficiently strong to grip the workpiece surface.

19 Claims, 4 Drawing Sheets

(58) Field of Classification Search
USPC .................................................. 294/183, 213
See application file for complete search history.

(56) References Cited

U.S. PATENT DOCUMENTS

| | | | |
|---|---|---|---|
| 6,644,703 B1 | 11/2003 | Levin et al. | |
| 9,760,023 B2* | 9/2017 | Toyomaki | G03F 7/70733 |
| 9,975,255 B1* | 5/2018 | Bosboom | H01L 21/68707 |
| 2006/0054774 A1 | 3/2006 | Yassour et al. | |
| 2006/0181095 A1* | 8/2006 | Bonora | H01L 21/6838 |
| | | | 294/183 |
| 2011/0115243 A1 | 5/2011 | Desai et al. | |
| 2014/0306474 A1* | 10/2014 | Schrameyer | H01L 21/68707 |
| | | | 294/213 |
| 2015/0015014 A1* | 1/2015 | Furuichi | B25J 15/0616 |
| | | | 294/183 |
| 2016/0001449 A1* | 1/2016 | Pergande | B25J 15/0019 |
| | | | 156/60 |
| 2018/0311832 A1 | 11/2018 | Bosboom et al. | |
| 2018/0350652 A1* | 12/2018 | Matsuhira | H01L 21/677 |

FOREIGN PATENT DOCUMENTS

| | | |
|---|---|---|
| JP | 2003-509227 | 3/2003 |
| JP | 2004-119448 | 5/2004 |
| JP | 2011-211119 | 10/2011 |
| JP | 2018-157221 | 10/2011 |
| JP | 5379589 | 12/2013 |
| JP | 2018-140445 | 9/2018 |
| KR | 20170130006 | 11/2017 |
| WO | WO 99/62107 | 12/1999 |
| WO | WO/2017035466 | 3/2017 |

\* cited by examiner

SUCTION GRIPPER FOR WARPED WORKPIECE

CROSS-REFERENCE TO RELATED APPLICATIONS

This application is a U.S. National Phase Application of PCT International Patent Application No. PCT/IL2020/050514 International Filing Date May 13, 2020, claiming the benefit of U.S. Provisional Patent Application No. 62/848,601, filed May 16, 2019, which is hereby incorporated by reference.

FIELD OF THE INVENTION

The present invention relates to wafer processing. More particularly, the present invention relates to a suction gripper adapted to grip a warped workpiece.

BACKGROUND OF THE INVENTION

Many applications require the gripping and manipulation of flat, thin workpieces. For example, in the manufacture of semiconductor devices, such as integrated circuits and other electronic components, a semiconducting substrate, typically in the form of a wafer, must be manipulated in order to apply a processing step to the substrate, or to inspect the substrate. An arm that grips the substrate may be manipulated to transport the substrate to a required location for processing or inspection.

A typical gripping arm for gripping a semiconducting substrate may apply suction in order to hold that substrate to the arm. Typically, the suction needs to be applied at three different points on the surface of a flat substrate in order that the arm may firmly and stably grip the substrate during such manipulations as translation, rotation, or tilting of the substrate.

SUMMARY OF THE INVENTION

There is thus provided, in accordance with an embodiment of the invention, a gripper to grip a workpiece, the gripper including: a body with a flat gripper surface, the gripper surface including a plurality of openings that are distributed over the gripper surface, each of the openings connectable to a source of suction; and at least one flow restrictor located between the plurality of openings and a connector of the gripper to the source of suction to restrict the inflow through each opening of the plurality of openings, such that when the suction is applied to the plurality of openings and a part of the workpiece surface covers at least one opening of the plurality of openings and another of the openings remains uncovered, the suction force at the covered opening is sufficiently strong to grip the workpiece surface.

Furthermore, in accordance with an embodiment of the invention, the body includes a plurality of arms that extend from a single base.

Furthermore, in accordance with an embodiment of the invention, a conduit from the connector to an opening of the plurality of openings extends along an arm of the plurality of arms.

Furthermore, in accordance with an embodiment of the invention, the gripper surface is contiguous.

Furthermore, in accordance with an embodiment of the invention, the at least one flow restrictor is located between an opening of the plurality of openings and a conduit that forms a fluid connection between that opening and the connector.

Furthermore, in accordance with an embodiment of the invention, the flow restrictor includes a plurality of baffles.

Furthermore, in accordance with an embodiment of the invention, the flow restrictor includes a self adaptive segmented orifice (SASO) with internally mounted staggered opposing fins.

Furthermore, in accordance with an embodiment of the invention, the flow restrictor includes a constriction.

Furthermore, in accordance with an embodiment of the invention, the flow restrictor includes a needle valve.

Furthermore, in accordance with an embodiment of the invention, an opening of the plurality of openings includes elastic sealing structure that is configured to form a seal between that opening and the workpiece surface when the suction is applied to that opening when the workpiece surface is in contact with the elastic sealing structure.

Furthermore, in accordance with an embodiment of the invention, the elastic sealing structure includes an elastic cup.

Furthermore, in accordance with an embodiment of the invention, the elastic sealing structure includes a pad or a gasket.

Furthermore, in accordance with an embodiment of the invention, the elastic sealing structure includes a polymer.

Furthermore, in accordance with an embodiment of the invention, the polymer includes silicone.

Furthermore, in accordance with an embodiment of the invention, the elastic sealing structure is connectible to the gripper surface via a stem that is insertable into the opening of the plurality of openings.

Furthermore, in accordance with an embodiment of the invention, the stem is in the form of a cylinder that is laterally truncated to form a flat lateral face.

Furthermore, in accordance with an embodiment of the invention, the at least one flow restrictor is located in a space between the lateral face and a cylindrical surface that surrounds the stem.

Furthermore, in accordance with an embodiment of the invention, an opening of the plurality of openings includes an extension mechanism to extend that opening outward from the gripper surface toward the workpiece surface.

Furthermore, in accordance with an embodiment of the invention, the extension mechanism is configured to extend the opening outward when the opening is not in contact with the workpiece surface.

Furthermore, in accordance with an embodiment of the invention, the extension mechanism is configured to enable a suction force to draw the opening toward the gripper surface when the suction is applied to the opening and the opening is in contact with the surface of the workpiece.

BRIEF DESCRIPTION OF THE DRAWINGS

In order for the present invention to be better understood and for its practical applications to be appreciated, the following Figures are provided and referenced hereafter. It should be noted that the Figures are given as examples only and in no way limit the scope of the invention. Like components are denoted by like reference numerals.

DETAILED DESCRIPTION OF THE INVENTION

Figure 1:
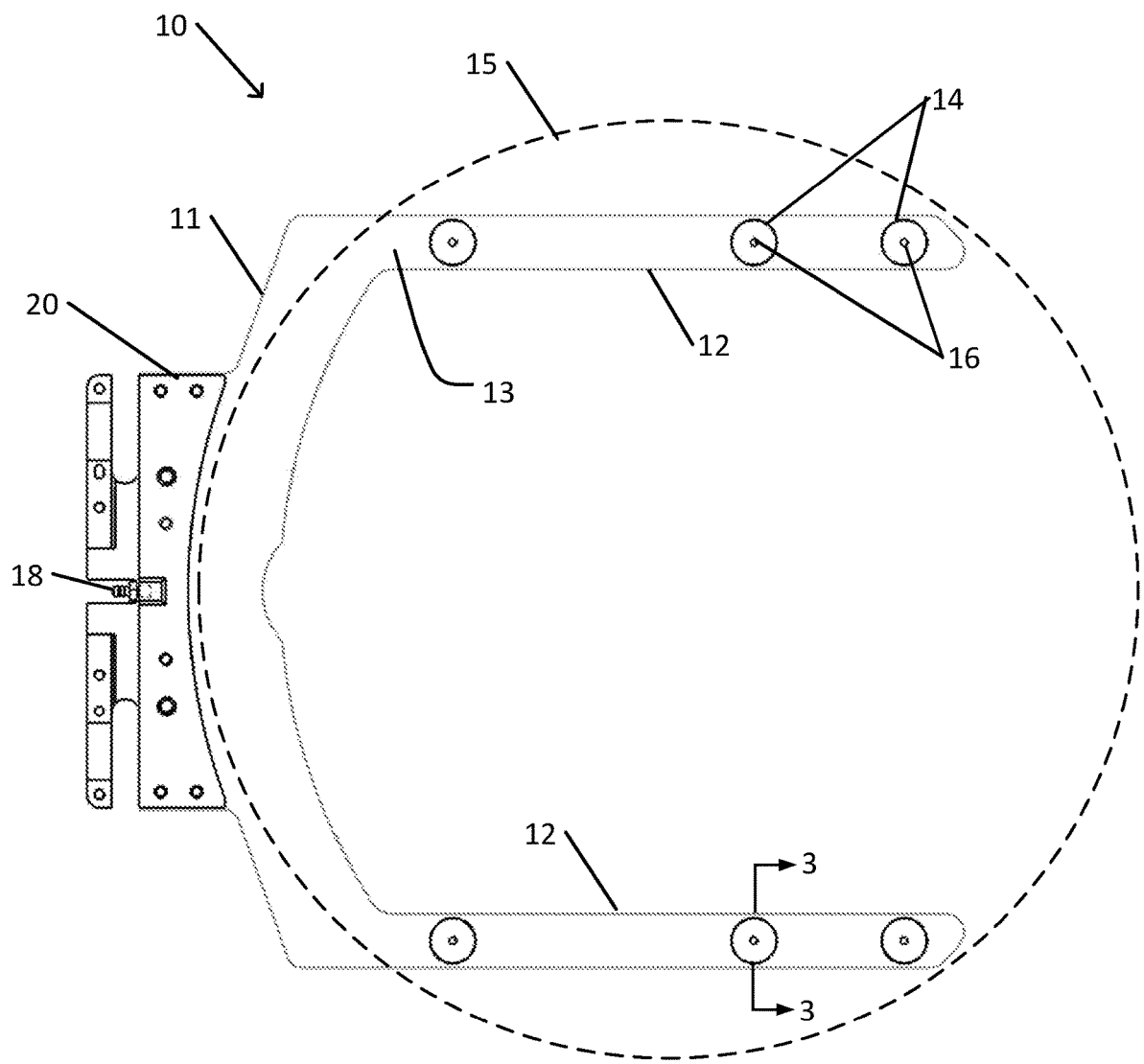
FIG. 1 is a schematic top view of a workpiece gripper with arms configured to grip a warped workpiece, in accordance with an embodiment of the present invention.

In the following detailed description, numerous specific details are set forth in order to provide a thorough understanding of the invention. However, it will be understood by those of ordinary skill in the art that the invention may be practiced without these specific details. In other instances, well-known methods, procedures, components, modules, units and/or circuits have not been described in detail so as not to obscure the invention.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulates and/or transforms data represented as physical (e.g., electronic) quantities within the computer's registers and/or memories into other data similarly represented as physical quantities within the computer's registers and/or memories or other information non-transitory storage medium (e.g., a memory) that may store instructions to perform operations and/or processes. Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method embodiments described herein are not constrained to a particular order or sequence. Additionally, some of the described method embodiments or elements thereof can occur or be performed simultaneously, at the same point in time, or concurrently. Unless otherwise indicated, the conjunction "or" as used herein is to be understood as inclusive (any or all of the stated options).

In accordance with an embodiment of the invention, a gripper for gripping a workpiece includes a gripper body with a flat gripper surface on which are distributed a plurality of suction openings. In some examples, the gripper body may be divided into one or more separate arms, e.g., that extend or branch off from a single base, or otherwise.

Each of the suction openings is connectable to a suction source via a conduit. For example, the suction source may include a blower, vacuum pump, or other source of suction. Each suction opening may be connected to the suction source via one or more connectors. When suction is provided to a suction opening that is in contact with a surface of the workpiece, the suction force may hold the workpiece to that suction opening.

One or more flow restrictors are located in a fluidic path between each of the suction openings and the suction source. The flow restrictors are configured to limit the rate of inflow through each suction opening, e.g., when that suction opening is not in contact with the surface of the workpiece. Due to action of the flow restrictors, the suction openings on the gripping surface that are in contact with the workpiece surface may firmly grip a nonplanar surface of a warped workpiece, even when some of the openings are not in contact with the workpiece surface (e.g., due to the warpage or tilting of the workpiece surface). A typical workpiece may include a thin and nominally flat semiconductor substrate or wafer, a pane of glass, or another type of workpiece that is ideally flat but that may become warped, e.g., during one or more processing steps.

In some examples, a sufficient number of the openings may be distributed over the flat gripping surface such that it is likely that at least two of the openings (preferably at least three) are able to draw a part of the workpiece surface to the opening so as to hold that part of the workpiece surface to the arm at the opening (e.g., as a result of the suction and the generated friction between the workpiece surface and the gripping surface of the arm). Alternatively or in additions, one or more of the suction openings may be provided with an extension mechanism that is configured to extend the suction opening from the gripper surface and toward the workpiece surface. This extension may ensure that a sufficient number of the openings come into contact with, and thus grip, a warped workpiece surface.

When the workpiece surface is warped, at least some of the suction openings may remain uncovered by the workpiece surface. The flow restrictors of each suction opening may restrict the suction such that the inflow of air through the uncovered suction openings does not break the suction that is applied by the covered surfaces. For example, the suction may create a vacuum that is sufficiently deep to reliably grip the workpiece. Therefore, the gripper arm may continue to firmly grip the workpiece surface. Thus, manipulation of the gripper, e.g., to translate, rotate, or tilt the arm, may reliably manipulate the gripped workpiece. For example, when all the suction openings are sealed by the workpiece then the vacuum may reach a gauge pressure of −800 mbar. When all of the suction openings are uncovered by the workpiece, the vacuum may reach a gauge pressure of −100 mbar. In other examples, other vacuum levels may be attained.

It may be noted that in the absence of flow restrictors, the unrestricted inflow through the uncovered openings could result in a direct flow from the uncovered openings to the suction connector with little or no pressure drop. Thus, no suction would be applied at the points where the workpiece surface contacts some of the suction openings.

In one example, a suction conduit extends along the interior of a gripper arm from the suction connector to the location of each of the suction openings. An opening conduit between the suction conduit and each suction opening includes a flow restrictor. For example, the flow restrictor may include baffles, fins, constrictions, or other structure that restricts the rate of inflow through that suction opening. In some cases, the flow restrictor may include a self adaptive segmented orifice (SASO), which includes internally mounted staggered opposing fins that are configured to increase flow resistance by enhancing generation of vortices in the flow. The flow restrictors may include other types of flow-restricting structure and may be located elsewhere between the suction opening and a connection to the suction source.

Each suction opening may be provided with structure to enhance friction forces between the gripper arm and the workpiece. For example, each suction opening may be surrounded by elastic sealing structure in the form of a cup, pad, gasket, or nipple that is made of an elastic material. When the suction draws the workpiece surface toward the suction opening, the inwardly pulling force may flatten the elastic sealing structure against the surface of the gripper arm. The flattening of the elastic sealing structure against the arm surface may increasing the area of contact between the workpiece surface and the arm surface, thus increasing the friction force that resists sliding of the workpiece over the arm surface. The material of which the elastic sealing structure is made may be selected so as to provide the required friction, while minimizing the risk of contamination of the workpiece surface by adhesion of the elastic sealing structure material to the workpiece surface. For example, a suitable material may include silicone, or another polymeric or other suitable material.

Suction openings that are provided with flow restrictors may provide an advantageous tradeoff in the handling of warped workpieces. On the one hand, when a gripping arm or surface has a limited number of suction openings, sealing of a suction opening by contact between the warped workpiece and the suction opening cannot be ensured as the wafer may only contact portions of the gripper arm where suction openings are absent. Increasing the rate of inflow through the suction opening may draw a portion of the workpiece to the suction opening to create a seal. On the other hand, in order that the gripper arm may grip the workpiece with sufficient strength to enable reliable and precise manipulation of the workpiece, the level of vacuum at the point where the workpiece seals the suction opening must be sufficiently deep to provide the required frictional force. In order that a suction source be capable of providing the required deep vacuum to all of the suction openings, inflow through an unsealed suction opening must be limited. Thus, providing each suction opening with a flow restrictor to limit inflow through the suction opening may enable a suction opening that is sealed by contact with the warped workpiece to provide sufficient friction to hold the workpiece to the gripper arm. Thus, the workpiece may be securely and reliably maneuvered by the gripper arm when the workpiece does not seal some of the suction openings.

FIG. 1 is a schematic top view of a workpiece gripper configured to grip a warped workpiece, in accordance with an embodiment of the present invention.

Workpiece gripper 10 includes a gripper body that includes at least one flat gripper surface 13. A plurality of suction grippers 14 are distributed on gripper surface 13.

In the example shown, gripper body 11 includes two gripper arms 12 that extend outward from gripper base 20. A plurality of suction grippers 14 are distributed along the length of each gripper arm 12. Each suction gripper 14 includes a suction opening 16. When a workpiece 15 is to be gripped by gripper arms 12 of workpiece gripper 10, workpiece 15 may be placed so as to cover at some of suction grippers 14. Suction that is applied to suction opening 16 of a suction gripper 14 when a region of the surface of workpiece 15 is in close proximity to that suction gripper 14 may draw that region toward suction opening 16 and gripper surface 13 to be gripped by suction gripper 14.

In other examples, there may be more than two gripper arms 12, or gripper surface 13 may include a contiguous surface instead of separate arms. The number of suction grippers 14 may be greater than or less than the number shown, and their distribution over each gripper arm 12 may be different than the pattern shown. The suction grippers may have different shapes, e.g., either symmetrical or asymmetrical, than the examples shown. In other examples, the suction opening of each suction gripper may not be at the center of the suction gripper. In another example, gripper body 11 may include two gripper surfaces 13, e.g., on opposite sides of gripper body 11.

In some cases, gripper arms 12 or suction grippers 14 may be arranged to enable workpiece gripper 10 to grip workpieces 15 of various sizes. For example, one set of suction grippers 14 may be arranged in an area that is the size of, or smaller than, a smaller workpiece. One or more other sets of suction grippers 14 may be arranged outside of the first set but within areas that correspond to one or more larger sizes of workpieces. For example, one or more additional gripper arms 12, each with suction grippers 14, may be arranged between the two gripper arms 12 of the example shown in order to enable gripper of a workpiece with a diameter or other dimension that is smaller than the distance between the two gripper arms 12 that are shown.

For example, a workpiece gripper may be configured to handle workpieces 15 of different sizes. In this case, some suction grippers 14 may be located on gripper surface 13 so as to grip the outer regions of a large workpiece 15 that are beyond the edge of a smaller workpiece 15. When a small workpiece 15 is gripped, these outer suction grippers 14 may remain uncovered. However, since these outer suction grippers 14 (as well as the other suction grippers 14) are provided with flow restrictors, the inner suction grippers 14 that are covered by the smaller workpiece 15 may be gripped by the covered inner suction grippers 14.

Workpiece gripper 10 may be connected to a manipulation mechanism via gripper base 20. For example, a manipulation mechanism may include a mechanism that may be operated to translate, rotate, or tilt a workpiece gripper 10 that is connected to the mechanism. Suction connector 18 may be connected to a suction source. For example, a suction source may include a vacuum pump, a blower, or other suction mechanism. Suction connector 18 may be located on gripper base 20, as shown, or may be located elsewhere on workpiece gripper 10.

In some examples, workpiece gripper 10 may include two or more suction connectors 18. For example, each gripper arm 12 of workpiece gripper 10 may be connected to a single or separate suction sources via a separate suction connector 18. Other arrangements are possible.

Typically, each suction opening 16 is connected via conduits, e.g., that are interior to gripper body 11, to suction connector 18. One or more flow restrictors are located between each suction opening 16 and a suction source that is connected to suction connector 18.

In another example, gripper surface 13 may form a single contiguous, unbranched surface, and gripper body 11 may include a single unbranched body.

Figure 2:
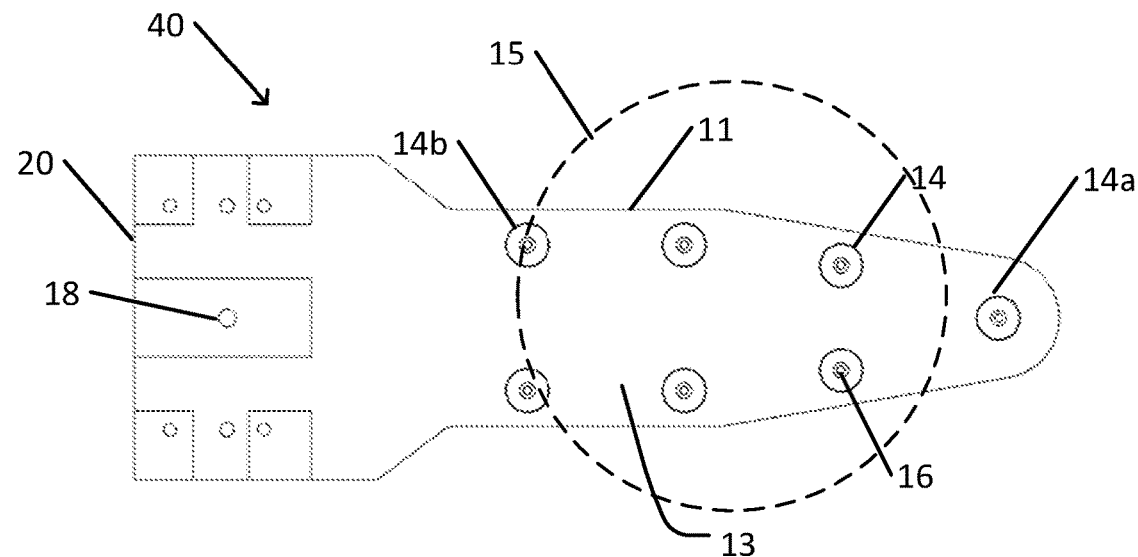
FIG. 2 is a schematic top view of a variant of the workpiece gripper shown in FIG. 1 with a contiguous gripper surface.

FIG. 2 is a schematic top view of a variant of the workpiece gripper shown in FIG. 1 with a contiguous gripper surface.

Gripper body 11 of workpiece gripper 40 is in the form of a contiguous body with no branching arms. Equivalently, gripper body 11 of workpiece gripper 40 may be considered to consist of a single arm. Similarly, gripper surface 13 is in the form of a contiguous surface (such that any two suction grippers 14 on gripper surface 13 may be connected by a line segment whose entire length extends along gripper surface 13 without crossing any intervening spaces). In some examples, gripper body 11 may have two similar or different gripper surfaces 13 on opposite faces of gripper body 11.

In the example shown, suction grippers 14 are arranged in two rows, e.g., each row corresponding to a location along an internal suction channel. In other examples, suction grippers 14 may be otherwise arranged on gripper surface 13.

Arrangement of suction grippers 14 along a contiguous gripper surface 13 may allow increased flexibility in gripping workpieces 15 of different sizes, e.g., by eliminating the possibility of a substantial part, or the whole, of a small workpiece 15 being located in a space between different arms of gripper surface 13. As described above, the flow restrictors that limit inflow through each suction gripper 14 may limit inflow through any suction grippers 14a that are not covered by workpiece 15, or through and suction grippers 14b that are partially covered by workpiece 15.

Figure 3:
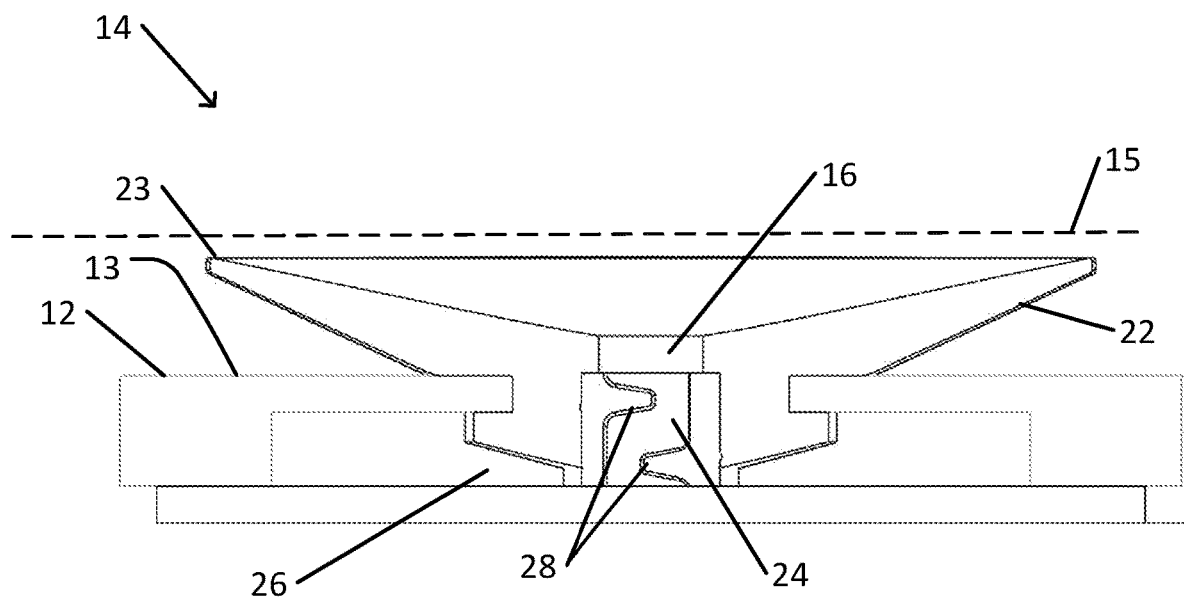
FIG. 3 is a schematic cross section through a suction gripper of the workpiece gripper shown in FIG. 1.

FIG. 3 is a schematic cross section through a suction gripper of the workpiece gripper shown in FIG. 1.

In the example shown, suction gripper 14 includes a single suction opening 16. In other examples, a suction gripper may include more than one suction opening.

Suction may be applied to suction opening 16 via a suction channel 26 that may extend internally to gripper body 11, e.g., along a gripper arm 12 along which suction gripper 14 is located. For example, a proximal end of suction channel 26 may be in fluidic connection with suction connector 18 of workpiece gripper 10. Typically, a single suction channel 26 may be connected to more than one suction opening 16. For example, all suction openings 16 along a single gripper arm 12 may open to a single suction channel 26.

In the example shown, suction opening 16 is connected to suction channel 26 (e.g., via an opening that is out of the plane of the section shown in FIG. 3) via flow restrictor 24. In the example shown, flow restrictor 24 is in the form of a labyrinthine channel within which flow is deflected by a plurality of baffles 28. Alternatively or in addition, a flow restrictor 24 may have another form, e.g., including a SASO structure, or another arrangement of one or more baffles, fins, constrictions, curves, twists, bends, or other structure to restrict the rate of inflow of air or another fluid via suction opening 16 and flow restrictor 24. Flow restrictor 24 may include an adjustable or nonadjustable needle valve or other constriction.

In the example shown, flow restrictor 24 is located between suction opening 16 and suction channel 26. Alternatively or in addition, a flow restrictor 24 may be located within suction channel 26 or suction connector 18, between suction channel 26 and suction connector 18, or elsewhere in a fluidic path between suction opening 16 and suction connector 18 (e.g., at a point where a suction channel 26 branches into two or more branch channels, each connecting to a different suction opening 16). For example, a single flow restrictor 24 may serve to restrict the inflow via two or more suction openings 16. Flow restrictor 24 may be located within gripper base 20, or in a conduit between a suction source and suction connector 18.

In the example shown, suction opening 16 is surrounded by elastic sealing structure in the form of elastic cup 22. When a surface of workpiece 15 is placed in the vicinity of suction opening 16 and suction is applied to suction opening 16, workpiece 15 may be drawn toward suction opening 16 and gripper surface 13. When workpiece 15 contacts rim 23 of elastic cup 22, the contact between workpiece 15 and rim 23 of elastic cup 22 may form a seal. Thus, the suction may create a partial vacuum within elastic cup 22 such that ambient air pressure pushes workpiece 15 toward suction opening 16.

Further drawing of workpiece 15 toward suction opening 16 may press elastic cup 22 toward gripper surface 13. The flexibility and elasticity of elastic cup 22 may enable elastic cup 22 to flatten between workpiece 15 and gripper surface 13. The flattening of elastic cup 22 may increase the area of contact between elastic cup 22 and workpiece 15. The increase in contact area may increase friction forces between workpiece 15 and the flattened elastic cup 22, and thus between workpiece 15 and suction gripper 14.

Alternative or in addition, the elastic sealing structure may have another form. For example, the elastic sealing structure may have the form of a pad, gasket, distortable nipple, or other structure that may form a seal between suction opening 16 and workpiece 15, and facilitate friction forces between workpiece 15 and suction gripper 14.

In some cases, e.g., when the surface of workpiece 15 is warped, one or more suction grippers 14 may not draw the surface of workpiece 15 sufficiently toward suction opening 16 of that suction gripper 14 in order to cover a suction opening 16 and form an airtight seal between workpiece 15 and that suction opening 16. The presence of flow restrictor 24 in the inflow path between suction opening 16 and suction connector 18 may restrict the rate of inflow through the uncovered suction opening 16. Since the rate of inflow through all uncovered suction openings 16, the suction that is applied to the covered and sealed suction openings 16 (assuming that workpiece 15 surface contacts at least some, preferably at least three, of suction openings 16) may remain sufficient to firmly grip workpiece 15 and allow reliable and precise manipulation of workpiece 15. (In the absence of flow restrictors, all of the suction that is applied via suction connector 18 could cause increased inflow through uncovered suction openings, breaking or preventing any application of suction via the covered suction openings.)

In the example shown, each suction gripper 14 and its elastic cup 22 (or similar elastic sealing structure) extends a fixed distance out of the surface of gripper arm 12 that faces workpiece 15. The number and placement of suction grippers 14 on each gripper arm 12, as well as the number and shapes of gripper arms 22, may be designed to ensure that a minimum number of suction grippers 14 are able to grip the surface of a even a warped workpiece (e.g., within a range of warpage that does not render workpiece 15 unusable). For example, in some cases gripping of a workpiece by two or more suction grippers 14 may be sufficient for workpiece gripper 10 to firmly grasp a workpiece. In some cases, gripping of a workpiece by three or more suction grippers 14 may be considered sufficient to stably and reliably grip a workpiece.

Figure 4A:
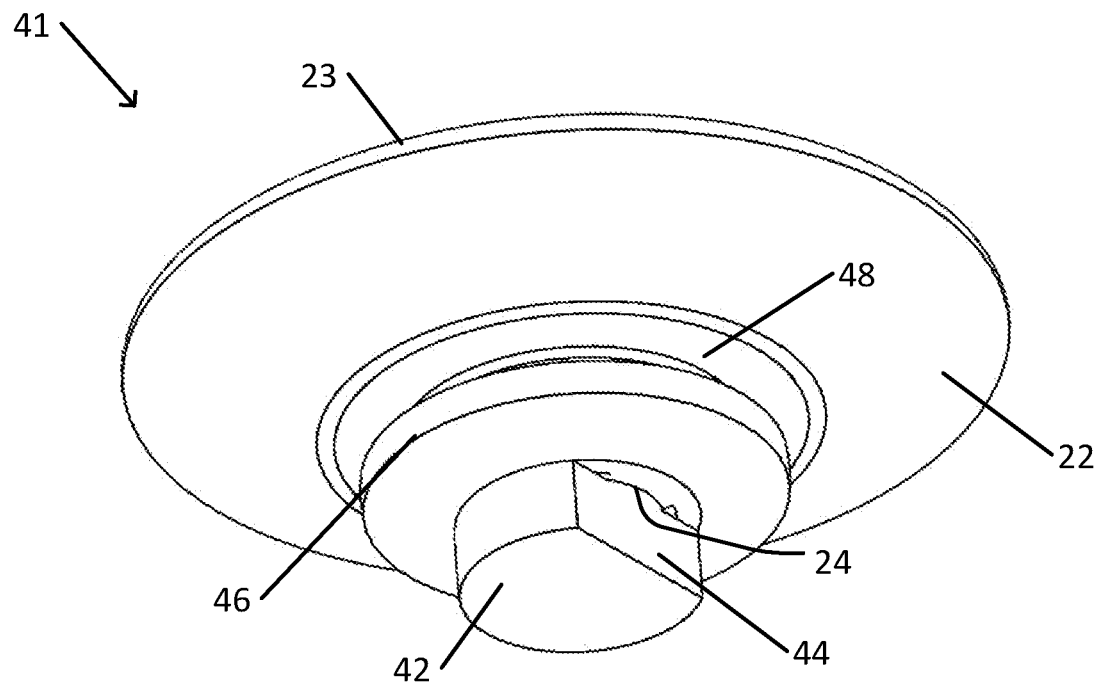
FIG. 4A schematically illustrates a variant of the suction gripper shown in FIG. 3.
Figure 4B:
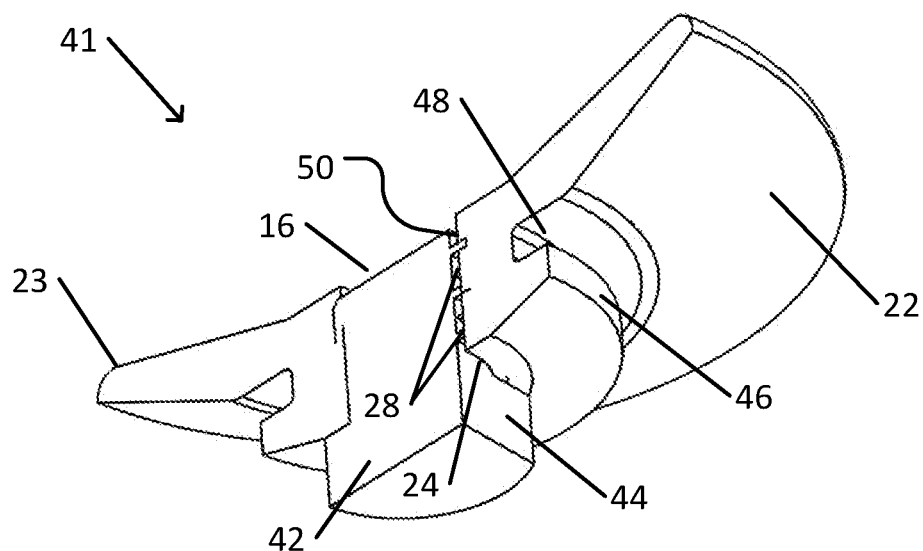
FIG. 4B is a schematic section of the suction gripper shown in FIG. 4A.

FIG. 4A schematically illustrates a variant of the suction gripper shown in FIG. 3. FIG. 4B is a schematic section of the suction gripper shown in FIG. 4A.

Suction gripper 41 is constructed similarly to suction gripper 14 (FIG. 3), including a suction opening 16 surrounded by elastic cup 22. For example, elastic cup 22 may be formed out of a flexible and resilient polymer, such as silicone, or another elastic material.

In one example, suction gripper 41 may be held in a circular opening on gripper surface 13. A region of gripper body 11 below the circular opening may include suction channel 26. For example, the circular opening may open into suction channel 26. The diameter of the circular opening may be less than the diameter of lip 46 but greater than the diameter of groove 48 between lip 46 and elastic cup 22. Lip 46 may also be constructed of an elastic material. For example, lip 46 and elastic cup 22 may be manufactured, e.g., molded, as a single piece.

For example, in order to attach suction gripper 41 to a circular opening in gripper surface 13, stem 42 of suction gripper 41 may be inserted into the opening until lip 46 passes through the opening (e.g., being bent or otherwise distorted during the insertion). Once lip 46 passes through the circular opening, the resilience of lip 46 may open lip 46 so as to prevent removal of suction gripper 41 from the circular opening. For example, a proximal outer surface of lip 46 may taper outward and distally toward elastic cup 22, so as to facilitate bending or folding of lip 46 to enable insertion of lip 46 through the circular opening. The tapering may impede bending of lip 46 proximally toward stem 42, thus impeding withdrawal of lip 46 from the circular opening.

In the example shown, stem 42 may be in the form of a circular cylinder that is laterally truncated to form a flat lateral face 44. Flow restrictor 24 connects suction opening 16 at a distal end of suction gripper 41 to a region between lateral face 44 of stem 42 and cylindrical inner surface 50 of an outer piece that includes elastic cup 22 and lip 46. Thus, cylindrical inner surface 50 surrounds at least part of the length of stem 42. The region between lateral face 44 and cylindrical inner surface 50 forms a fluidic connection between suction opening 16 and a proximal (e.g., to lip 46) end of stem 42. In the example shown, baffles 28 of flow restrictor 24 are located in the space between lateral face 42 and cylindrical inner surface 50.

In the example when stem 42 is inserted into a circular opening that is open to suction conduit 26, inflow may be blocked by a snug interface between cylindrical inner surface 50 and the cylindrical outer surface of stem 42, except along lateral face 44. The space between lateral face 44 and cylindrical inner surface 50 forms a fluidic connection between suction opening 16 and suction conduit 26. The fluidic connection between suction opening 16 and suction conduit 26 includes structure (baffles 28, in the example shown, or other structure) to form flow restrictor 24. Thus, inflow via suction gripper 41 may be limited, even when not in contact with a surface of a workpiece 15.

Other configurations of a suction gripper are possible.

Alternatively or in addition, one or more of the suction grippers of workpiece gripper 10 may be extendible by an adjustable length out of gripper arm 12 toward workpiece 15. When a warped workpiece is gripped by a plurality of the extendible suction grippers and drawn toward gripper arm 12, some of the extendible suction grippers may extend outward from gripper arm 12 so as to maintain the grip while compensating for any warpage.

Figure 5:
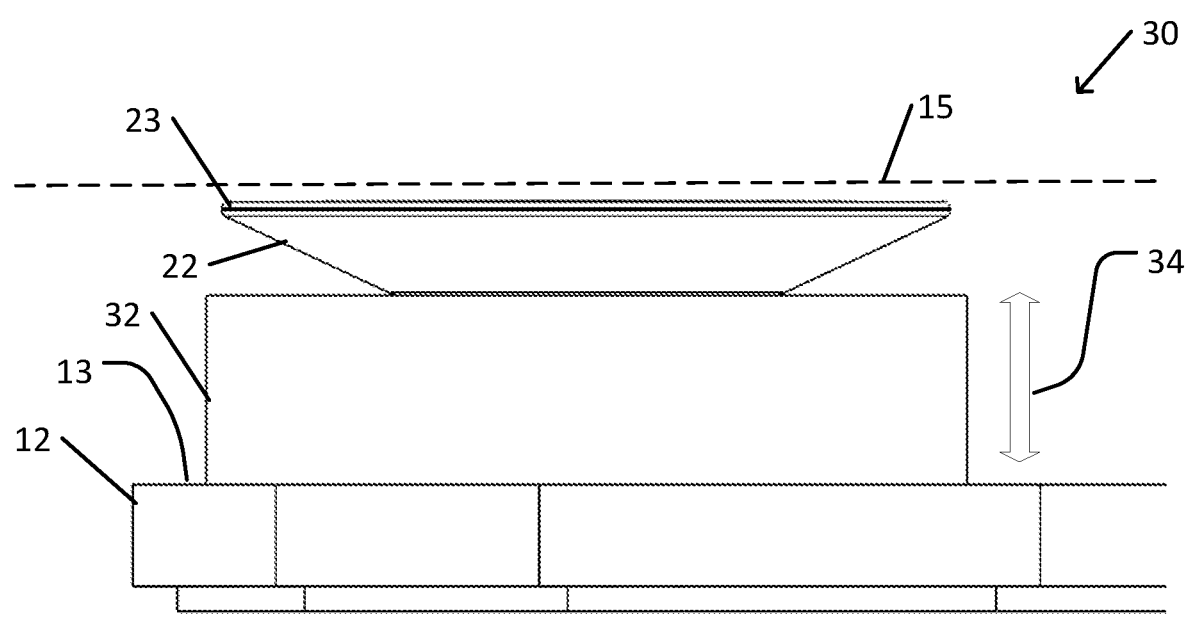
FIG. 5 is a schematic side view of a variant of a suction gripper in which the suction gripper is extendible from the workpiece gripper.

FIG. 5 is a schematic side view of a variant of a suction gripper in which the suction gripper is extendible from the workpiece gripper.

Extendible suction gripper 30 includes extension mechanism 32 to extend the distal end of extendible suction gripper 30 (on which elastic cup 22 is located, in the example shown) by a variable distance from gripper arm 12. Extension and retraction or compression of extension mechanism 32 to change the variable distance is represented by arrow 34.

In the example shown, extendible suction gripper 30 is constructed similarly to suction gripper 14, as shown in FIG. 3. For example, extendible suction gripper 30 includes elastic sealing structure (in the form of elastic cup 22, as shown, or a pad, gasket, nipple, or other elastic sealing structure) that surrounds a suction opening 16 (not visible in the side view of FIG. 5). Suction opening 16 is provided with one or more flow restrictors 24 between suction opening 16 and a connection to a suction source (e.g., suction connector 18 or similar structure) that applies the suction to suction opening 16 and extendible suction gripper 30. For example, flow restrictor 24 may be located within extendible suction gripper 30, gripper arm 12, gripper base 20, or elsewhere within workpiece gripper 10.

In one example of extension mechanism 32, extension mechanism 32 includes a mechanism that is configured to fully extend extendible suction gripper 30 when extendible suction gripper 30 does not grip a workpiece. Thus, until an extendible suction gripper 30 grips a part of the surface of a workpiece, extendible suction gripper 30 is normally extended.

In one example, extension mechanism 32 may include one or more elastic mechanical or pneumatic elements that are fully extended when not compressed. For example, an elastic element may include one or more compressible springs or bars that are fully extended when not compressed. The compressible elements may extend within extension mechanism 32 from a point near the distal end of extension mechanism 32 to a proximal point, e.g., within gripper arm 12. When the element is compressed, part of extension mechanism 32 may be pushed into gripper arm 12, or telescoping or foldable walls of extension mechanism 32 may shorten.

As another example, outer walls of extension mechanism 32 may include resilient accordion folds or are otherwise constructed to enable a compression force to crumple or crush the walls of extension mechanism 32, while enabling the walls to recover their uncompressed extended shape when the compressing force is removed.

A pneumatic element may include a sealed tube with two or more telescoping segments that enable the tube to shorten when subjected to a compression force. For example, the sealed tube may extend within extension mechanism 32 from a point near the distal end of extension mechanism 32 to a proximal point, e.g., within gripper arm 12. Alternatively or in addition, extension mechanism 32 may include a chamber into which pressurize air or another fluid may be introduced. For example, air may be blown into the chamber from an exhaust mechanism of a suction source that applies suction to suction openings 16.

With a normally extended extendible suction gripper 30, the surface of a workpiece may be made (e.g., by a robotic or other automatic mechanism, or by a manually controlled mechanism, or otherwise) to approach gripper arms 12 of a workpiece gripper 10 that includes one or more extended extendible suction grippers 30. Typically, suction is applied to the suction opening 16 of each extendible suction gripper 30 (as well as the suction opening 16 of any suction gripper 14 that is not extendible) of workpiece gripper 10 as workpiece 15 approaches gripper arms 12.

Typically, when a region of the surface of workpiece 15 is brought sufficiently near the distal end of one or more extendible suction grippers 30, one or more regions of the surface of workpiece 15 may initially contact part of the elastic sealing structure (e.g., part of rim 23 of elastic cup 22) at the distal end of an extended extendible suction gripper 30. The suction that is applied to that extendible suction gripper 30 may cause the elastic sealing structure and the surface of workpiece 15 to draw together. Thus, the elastic sealing structure may form a seal between workpiece 15 and that extendible suction gripper 30. For example, the entire rim of an elastic sealing structure in the form of elastic cup 22 may be drawn toward and into physical contact with the surface of workpiece 15. Thus, the interior of elastic cup 22 (or other elastic sealing structure) may form a chamber whose only opening is suction opening 16.

In this case, continued application of suction to suction opening 16 may draw fluid out of the chamber formed between the surface of workpiece 15 and elastic cup 22 (or other elastic sealing structure). As a result, the suction force may overcome the distally pushing force of extension mechanism 32 and draw the distal end of extendible suction gripper 30, with the attached surface of workpiece 15, proximally toward gripper arm 12. The proximal inward motion of the surface of workpiece 15 may increase the likelihood that the surface of workpiece 15 will be similarly gripped by other extendible suction grippers 30 or suction grippers 14.

The presence of flow restrictors 24 may limit the inflow through any extendible suction gripper 30 or suction gripper 14 that is not in contact with, and thus not sealed by, the surface of workpiece 15. The limited inflow may thus ensure that the suction force that is applied by any extendible suction gripper 30 or suction gripper 14 that is in contact with the surface of workpiece 15 is able to maintain the contact.

Alternatively or in addition, extension mechanism 32 may include a controllable motor (e.g., an electrically powered motor with a transmission that converts circular motion of the motor to linear motion of extension mechanism 32) or actuator (e.g., a linear actuator, e.g., electrically operated) that is operable, e.g., by a controller of workpiece gripper 10, to extend or retract the distal end of extendible suction gripper 30. For example, gripper arm 12, extendible suction gripper 30, or workpiece gripper 10 may be provided with a sensor that is configured to sense the proximity of a section of the surface of workpiece 15 that is near an extendible suction gripper 30. When the proximity is detected, extension mechanism 32 may be operated to extend extendible suction gripper 30 toward workpiece 15. When contact is sensed (e.g., by a sensor that detects a decrease in inflow via suction opening 16 of that extendible suction gripper 30), extension mechanism 32 may be operated to pull the surface of workpiece 15 toward gripper arm 12.

Other types of mechanisms are possible for operation of extension mechanism 32. Extension mechanism 32 may facilitate gripping of a workpiece by workpiece gripper 10 by enabling positioning of the distal end of extendible suction gripper 30 sufficiently close to the surface of workpiece 15 to grip the surface, despite the restricted inflow through each suction opening 16 as limited by flow restrictor 24.

Different embodiments are disclosed herein. Features of certain embodiments may be combined with features of other embodiments; thus certain embodiments may be combinations of features of multiple embodiments. The foregoing description of the embodiments of the invention has been presented for the purposes of illustration and description. It is not intended to be exhaustive or to limit the invention to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes as fall within the true spirit of the invention.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:

1. A gripper to grip a workpiece, the gripper comprising:
a body with a flat gripper surface, the gripper surface including a plurality of openings that are distributed over the gripper surface, each of the openings connectable to a source of suction; and
at least one flow restrictor located between the plurality of openings and a connector of the gripper to the source of suction to restrict the inflow through each opening of the plurality of openings, such that when the suction is applied to the plurality of openings and a part of the workpiece surface covers at least one opening of the plurality of openings and another of the openings remains uncovered, the suction force at the covered opening is sufficiently strong to grip the workpiece surface,
wherein an opening of one or more of the plurality of openings includes elastic sealing structure that is configured to form a seal between that opening and the workpiece surface when the suction is applied to that opening when the workpiece surface is in contact with the elastic sealing structure.

2. The gripper of claim 1, wherein the body comprises a plurality of arms that extend from a single base.

3. The gripper of claim 2, wherein a conduit from the connector to an opening of the plurality of openings extends along an arm of the plurality of arms.

4. The gripper of claim 1, wherein the gripper surface is contiguous.

5. The gripper of claim 1, wherein said at least one flow restrictor is located between an opening of the plurality of openings and a conduit that forms a fluid connection between that opening and the connector.

6. The gripper of claim 1, wherein the flow restrictor comprises a plurality of baffles.

7. The gripper of claim 6, wherein the flow restrictor comprises a self adaptive segmented orifice (SASO) with internally mounted staggered opposing fins.

8. The gripper of claim 1, wherein the flow restrictor comprises a constriction.

9. The gripper of claim 8, wherein the flow restrictor comprises a needle valve.

10. The gripper of claim 1, wherein the elastic sealing structure comprises an elastic cup.

11. The gripper of claim 1, wherein the elastic sealing structure comprises a pad or a gasket.

12. The gripper of claim 1, wherein the elastic sealing structure comprises a polymer.

13. The gripper of claim 12, wherein the polymer comprises silicone.

14. The gripper of claim 1, wherein the elastic sealing structure is connectible to the gripper surface via a stem that is insertable into said opening of the plurality of openings.

15. The gripper of claim 14, wherein the stem is in the form of a cylinder that is laterally truncated to form a flat lateral face.

16. The gripper of claim 15, wherein said at least one flow restrictor is located in a space between the lateral face and a cylindrical surface that surrounds the stem.

17. The gripper of claim 1, wherein an opening of the plurality of openings comprises an extension mechanism to extend that opening outward from the gripper surface toward the workpiece surface.

18. The gripper of claim 17, wherein the extension mechanism is configured to extend the opening outward when the opening is not in contact with the workpiece surface.

19. The gripper of claim 18, wherein the extension mechanism is configured to enable a suction force to draw the opening toward the gripper surface when the suction is applied to the opening and the opening is in contact with the surface of the workpiece.

\* \* \* \* \*